(12) United States Patent
Ur et al.

(10) Patent No.: US 7,003,420 B2
(45) Date of Patent: Feb. 21, 2006

(54) LATE BINDING OF VARIABLES DURING TEST CASE GENERATION FOR HARDWARE AND SOFTWARE DESIGN VERIFICATION

(75) Inventors: Shmuel Ur, Misgav (IL); Avi Ziv, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 10/699,227

(22) Filed: Oct. 31, 2003

(65) Prior Publication Data

US 2005/0096861 A1    May 5, 2005

(51) Int. Cl.
    *G01R 27/28* (2006.01)
(52) U.S. Cl. .................. 702/117; 702/119; 702/123
(58) Field of Classification Search .............. None
    See application file for complete search history.

(56) References Cited

U.S. PATENT DOCUMENTS 6,243,862 B1 *   6/2001   Lebow ................. 717/131

OTHER PUBLICATIONS

Lichtenstein, Yossi et al., "Model Based Test Generation for Processor Verification", Sixth Innovative Applications of Artificial Intelligence Conference, Aug. 1994, pp. 83-94.
Chandra, A. et al., "AVPGEN—A Test Generator for Architecture Verification", IEEE Trans. on Very Large Scale Integration (VLSI) Systems, vol. 3, No. 2, pp. 188-200 (Jun. 1995).
O'Krafka, Brian et al., "MPTG: A Portable Test Generator for Cache-Coherent Multiprocessors", International Conference on Computers and Communicatins, 1995 IEEE, pp. 38-44.
Bergmann, Jules et al., "Improving Coverage Analysis and Test Generation for Large Designs". Proceedings of the International Conference on Computer Design, pp. 580-583, Nov. 1999.
Seger, C.J. et al., "Formal Verification by Symbolic Evaluation of Partially-Ordered Trajectories" Formal Methods in System Design: An International Journal, 6(2): 147-189, Mar. 1995.
Edelstein, O., et al., "Multithreaded Java Program Test Generation", IBM Systems Journal, vol. 41, No. 1, 2002, pp. 111-125.
Stoller, S. et al., "Model-Checking Multi-Threaded Distributed Java Programs", Proceedings of the 7th International SPIN Workshop on Model Checking of Software, pp. 224-244, New York, 2000.

* cited by examiner

*Primary Examiner*—Michael Nghiem
*Assistant Examiner*—Stephen J. Cherry
(74) *Attorney, Agent, or Firm*—Stephen C. Kaufman

(57) ABSTRACT

Methods and systems are provided that improve design verification by test generators by delaying assignment of values in the generated stimuli until these values are used in the design. Late binding allows the generator to have a more accurate view of the state of the design, and in order to choose correct values. Late binding can significantly improve test coverage with a reasonable performance penalty as measured by simulation time.

22 Claims, 6 Drawing Sheets

| INPUTS | | BASIC ALGORITHM | | | "SMART" RESOLUTION | | |
|---|---|---|---|---|---|---|---|
| A | B | A | B | Y | A | B | Y |
| 0 | 0 | 0 | 0 | 0 | 0 | 0 | 0 |
| 0 | 1 | 0 | 1 | 0 | 0 | 1 | 0 |
| 0 | $U_B$ | 0 | $R_B$ | 0 | 0 | $U_B$ | 0 |
| 1 | 0 | 1 | 0 | 0 | 1 | 0 | 0 |
| 1 | 1 | 1 | 1 | 1 | 1 | 1 | 0 |
| 1 | $U_B$ | 1 | $R_B$ | $R_B$ | 1 | $U_B$ | $U_B$ |
| $U_A$ | 0 | $R_A$ | 0 | 0 | $U_A$ | 0 | 0 |
| $U_A$ | 1 | $R_A$ | 1 | $R_A$ | $U_A$ | 1 | $U_A$ |
| $U_A$ | $U_B$ | $R_A$ | $R_B$ | $R_A \cdot R_B$ | $R_A$ | $R_B$ | $R_A \cdot R_B$ |

|  | WITHOUT LATE-BINDING | LATE-BINDING NOT USED | LATE-BINDING USED |
|---|---|---|---|
| MODEL 1 | 20.5 | 22.1 (8%) | 27.3 (33%) |
| MODEL 2 | 43.6 | 47.8 (10%) | 54.3 (25%) |

LATE BINDING OF VARIABLES DURING TEST CASE GENERATION FOR HARDWARE AND SOFTWARE DESIGN VERIFICATION

BACKGROUND OF THE INVENTION

1. Field of the Invention

This invention generally relates to design verification, and more specifically relates to test program generation in a context of a computer mechanism and methods for testing a design for compliance with the design specification.

2. Description of the Related Art

An important aspect of designing a hardware or software design, for example an advanced computer processor, is the ability to test the design of the processor thoroughly, in order to assure that the design complies with desired architectural, performance and design specifications. In current industrial practice, most of the verification is done by generating a very large number of tests by random test generators.

Test program generators are basically sophisticated software engines, which are used to create numerous test cases. By appropriate configuration, it is possible for test generation to be focused on very specific ranges of conditions, or broadened to cover a wide range of logic. Today, large numbers of test cases can be created automatically in the time that a single test case could be written manually, as was done prior to the advent of test case generators. Modern test program generators are sophisticated enough to evaluate the microarchitectural implementation of a processor.

Typically, the input to the test program generator is a user-defined sequence of partially specified instructions, known as an instruction stream, which acts as a template for the test to be generated. The instruction stream is generally incomplete, in that various details of each instruction, such as the specific source and the target resources to be used, the data values of each uninitialized resource, and even the exact instruction to be generated, may be left unspecified. The test program generator then generates a complete test by filling in the missing information with random values. The choice of random values is often biased, so as to increase the likelihood of detecting a design flaw. The use of templates in this manner allows the creation of numerous test cases that stress the implementation of the logic, creating various conditions such as "buffer full", or "pipe stall".

An example of a conventional test program generator is the IBM tool, Genesys, which is disclosed in the document *Model-Based Test Generation for Process Design Verification,* Y. Lichtenstein et. al., Sixth Innovative Applications of Artificial Intelligence Conference, August 1994, pp. 83–94. An updated version, of Genesys, known as Genesys-Pro, is a generic random test generator, targeted at the architectural level and applicable to any architecture.

Another conventional test program generator, AVPGEN, is disclosed in the document *AVPGEN—A Generator for Architecture Verification Test Cases,* A. Chandra, et al., IEEE Trans. Very Large Scale Integration (VLSI) Syst. 3, No. 2, pp. 188–200 (June 1995).

Still another test generator is disclosed in the publication B. O'Krafka, et al., *MPTG: A Portable Test Generator for Cache-Coherent Multiprocessors,* International Conference on Computers and Communications, 1995, pp. 38–44. This generator is capable of generating tests that include scenarios with unpredictable results and relies on checks carried out for intermediate points in the test.

The principles of the present invention may be applied to any of the above-noted test generators, as well as other test pattern generation tools, such as the verification automation tool SpecMan™ available from Verisity™, 2041 Landings Drive, Mountain View, Calif. 94043 and the Vera Testbench Automation product, available from Synopsys, Inc. 700 East Middlefield Road, Mountain View, Calif. 94043. A method previously used to increase the capability of test generators examines the state of the design before generating the next input. In this method, often referred to as dynamic generation, the test generator uses the state of the design to determine inputs having the best chances of producing an interesting test case. For example, if the goal of the test generator is to create resource interdependency in the pipelines of a processor, it generates instructions that use the same resources as the instructions already in the pipelines.

An alternative approach to improve coverage uses symbolic simulation and symbolic trajectory evaluation techniques. These techniques are described, respectively, in the documents *Improving Coverage Analysis and Test Generation for Large Designs,* J. Bergmann and M. Horowitz, Proceedings of the International Conference on Computer Design, pp. 580–583, November 1999, and *Formal verification by Symbolic Evaluation of Partially-ordered Trajectories,* C. J. H. Seger and R. E. Bryant, Formal Methods in System Design: An International Journal, 6(2): 147–189, March 1995. In symbolic simulation, some of the inputs to the design are represented as symbols. These symbols propagate through the circuit to the outputs. The main advantage of symbolic simulation is that large spaces can be covered in parallel, with a single symbolic input. However, this technique still suffers from explosion of the symbol representation, and thus it is limited to small designs. In addition, it is difficult for symbolic simulators to simulate complex functions and operators, such as multiplication.

A third approach builds test generators that include a precise model of the verified designs. Using this model, the test generator represents a desired event as a state-machine traversal problem or a constraint satisfaction problem. A solution of this problem yields a test case in which the desired event occurs. The main disadvantage of this approach is that it requires considerable effort to specify of the model and build the generation engine.

The use of such advanced random test generators may increase the quality of generated tests, but cannot ensure that all the "dark corners" in the design are exposed, and that the entire design is adequately exercised. The term dark corners as used herein with respect to the design refers to events that are difficult to anticipate in practice, and for which test cases are difficult to construct using test generators. Typical dark corners include transient interdependencies of resources of a processor. Coverage analysis helps detect non-covered events, but does not help cover these events. Generation of interesting test cases that reach these difficult-to-cover dark corners is one of the main challenges in functional design verification.

In the case of software designs, the main problem in testing concurrent programs is their nondeterminism: two executions of such a program may yield different results. Most of the work in the field of concurrent testing has been focused on detecting race conditions. However, race conditions have a low probability of manifesting themselves, and even when they do it is not always an indication of a fault.

One approach to testing software designs is disclosed in the documents O. Edelstein, E. Farchi, Y. Nir, G. Ratsaby, and S. Ur., *Multithreaded Java Program Test Generation. IBM Systems Journal,* 41(1):111–125, 2002, and S. D. Stoller. *Model-checking Multi-threaded Distributed Java Programs,* in Proceedings of the 7th International SPIN Workshop on Model Checking of Software, pages 224–244, New York, 2000. Springer Verlag. The problem of generating different interleaving for the purpose of revealing concurrent faults was approached by seeding the program with conditional sleep statements at shared memory access and synchronization events. At run time, random, biased random, or coverage-based decisions were taken as to whether to execute seeded primitives.

SUMMARY OF THE INVENTION

One problem with the approach of dynamic generation is that in many cases, by the time the generated inputs progress to the area of interest, the state of the design has changed, and the reason that led to the generation of the inputs no longer exists. For instance, it is possible that the test generator, in an attempt to create interdependency in execution pipelines of a processor, assigns a register R1, for example, because this register is currently in use in the execution pipeline. However, by the time the generated instruction reaches the execution pipeline, the instruction that used the register R1 may have finished its execution. The requested interdependency event never occurs.

According to a disclosed embodiment of the invention, late binding of variables is employed in a test generator in order to improve test coverage significantly with a reasonable performance penalty.

A test generator delays binding of values to variables during generation of test cases until these values are needed by the design. Each variable in the design is associated with a Boolean flag that indicates if the resource has a valid value, or has been evaluated such that its information content is known, or whether its information content is as yet undefined. Each such variable is associated with a linked list that points to other resources that should have the same value. Algorithms are presented, which enable the test generator to handle access to variables with the unidentified values, and deferring binding of the value until it becomes necessary. The technique is powerful enough to handle any arbitrary Boolean function. Experimentally, the late binding technique according to the invention improves the quality and rapidity of test coverage, with a reasonable performance penalty during simulation.

The invention provides a method of verifying a design, which is carried out by generating a test case for execution using the design. One of the resources in the design is required at a predetermined time to accommodate a signal during execution of the test case. The method is further carried out by designating the one resource as an unidentified resource, delaying binding the signal to the unidentified resource until immediately prior to the predetermined time, thereafter binding the signal to the unidentified resource to define a bound resource, and accessing the bound resource.

In another aspect of the method, prior to the predetermined time, the unidentified resource is copied to another resource, and after passage of the predetermined time, the signal and the other resource are bound together.

According to an additional aspect of the method, the signal is an outcome determinative input to a Boolean function.

One aspect of the method includes designating a second unidentified resource for accommodation of a second signal that is a second input of the Boolean function, wherein an output of the Boolean function is insensitive to the second input, and avoiding binding the second unidentified resource with the second signal during execution of the test case.

The invention provides a computer software product, including a computer-readable medium in which computer program instructions are stored, which instructions, when read by a computer, cause the computer to verify a design by generating a test case for execution using the design. One of the resources in the design is required at a predetermined time to accommodate a signal during execution of the test case. The method is further carried out by designating the one resource as an unidentified resource, delaying binding the signal with the unidentified resource until immediately prior to the predetermined time, thereafter binding the signal with the unidentified resource to define a bound resource, and accessing the bound resource.

The invention provides a verification system of verifying a design, including a test generator adapted to generate a test case for execution using the design, wherein the design includes a plurality of resources. One of the resources is required at a predetermined time to accommodate a signal during execution of the test case. The test generator is further adapted to designate the one resource as an unidentified resource, and to delay binding the signal with the unidentified resource until immediately prior to the predetermined time, thereafter binding the signal and the unidentified resource to define a bound resource, and accessing the bound resource.

The invention provides a method of verifying a design, which is carried out by generating a stream of instructions, the stream including a first instruction that references an unidentified first resource, setting a first flag that designates the first resource as unidentified, copying the first resource to a second resource, setting a second flag that designates the second resource as unidentified, including the second resource in a set of unidentified resources that is associated with the first resource, wherein each member of the set has a status flag designating the member as unidentified, and thereafter identifying the second resource, clearing the second flag, and removing the second resource from the set.

In one aspect of the method, identifying the second resource also includes identifying each member of the set with the second resource, and clearing the status flag of each member.

Another aspect of the method includes accessing the second resource.

In yet another aspect of the method, identifying the second resource includes requesting a content of the second resource.

The invention provides a computer software product, including a computer-readable medium in which computer program instructions are stored, which instructions, when read by a computer, cause the computer to perform a method of verifying a design, which is carried out by generating a stream of instructions, the stream including a first instruction that references an unidentified first resource, setting a first flag that designates the first resource as unidentified, copying the first resource to a second resource, setting a second flag that designates the second resource as unidentified, including the second resource in a set of unidentified resources that is associated with the first resource, wherein each member of the set has a status flag designating the member as unidentified, and thereafter identifying the second resource, clearing the second flag, and removing the second resource from the set.

The invention provides a verification system for verifying a design, including a test generator adapted to perform a method that includes generating a stream of instructions, the stream including a first instruction that references an unidentified first resource, setting a first flag that designates the first resource as unidentified, copying the first resource to a second resource, setting a second flag that designates the second resource as unidentified, including the second resource in a set of unidentified resources that is associated with the first resource, wherein each member of the set has a status flag designating the member as unidentified, and thereafter identifying the second resource, clearing the second flag, and removing the second resource from the set.

The invention provides a method of verifying a design, which is carried out by generating a stream of instructions for evaluation of a Boolean function in the design, constructing a set of inputs for the Boolean function, the set including members having unidentified input resources, and wherein the inputs are outcome determinative of the Boolean function. The method is further carried out by selecting one of the members, resolving an identity of the selected member, excluding the selected member from the set of inputs, removing all remaining members of the set of inputs that are no longer outcome determinative of the Boolean function, iterating the steps of selecting, resolving, excluding and removing until no more than one member remains in the set of inputs, and determining the output resource as a copy of the one member.

An aspect of the method includes setting a flag that designates the output resource as unidentified, and including the output resource in a set of unidentified resources that is associated with the one member, respective status flags being associated with each member of the set of unidentified resources that designate an unidentified status thereof.

An additional aspect of the method includes associating a respective inversion flag with each of the input resources and the output resource that indicates an inversion status thereof, and setting the inversion flag of the output resource to a negation of the inversion flag of the input resource that corresponds to the one member.

The invention provides a computer software product, including a computer-readable medium in which computer program instructions are stored, which instructions, when read by a computer, cause the computer to perform a method of verifying a design, which is carried out by generating a stream of instructions for evaluation of a Boolean function in the design, constructing a set of inputs for the Boolean function, the set including members having unidentified input resources, and wherein the inputs are outcome determinative of the Boolean function. The method is further carried out by selecting one of the members, resolving an identity of the selected member, excluding the selected member from the set of inputs, removing all remaining members of the set of inputs that are no longer outcome determinative of the Boolean function, iterating the steps of selecting, resolving, excluding and removing until no more than one member remains in the set of inputs, and determining the output resource as a copy of the one member.

The invention provides a verification system of verifying a design, including a test generator adapted to perform a method that includes generating a stream of instructions for evaluation of a Boolean function in the design, constructing a set of inputs for the Boolean function, wherein input resources associated with members of the set of inputs are unidentified, and wherein the inputs are outcome determinative of the Boolean function. The method is further carried out by selecting one of the members, resolving an identity of the selected member, excluding the selected member from the set of inputs, removing all remaining members of the set of inputs that are no longer outcome determinative of the Boolean function, and iterating the steps of selecting, resolving, excluding and removing until no more than one member remains in the set of inputs.

The invention provides a verification system for a computer program-under-test, including a case generator that accepts the program-under-test as a program input, a simulator for executing the program-under-test responsive to values provided by the case generator, and a late binding component that accepts a request for user input responsively to the program-under-test, the late binding component being adapted to hold the request for user input in a memory, and for associating an unidentified resource with the request for user input. The system further includes a tracking component for determining when the unidentified resource is actually required in the simulator, and a user interface linked to the tracking component for accepting information to satisfy the request for user input, wherein responsively to the user interface the tracking component binds the information to the unidentified resource.

According to an aspect of the verification system, the case generator is further adapted to present a context of the program-under-test on the user interface.

According to a further aspect of the verification system, the case generator is adapted to report an actual requirement for the user input in the simulator.

The invention provides a method for verifying a computer program-under-test, which is carried out by accepting a request for user input responsively to the program-under-test, memorizing the request for user input, associating an unidentified resource with the request for user input, determining when the unidentified resource is actually required in an execution of the program-under-test, and thereafter accepting information from a user to satisfy the request for user input, binding the information to the unidentified resource to define a late-bound resource, and using the late-bound resource in the execution of the program-under-test.

The invention provides a computer software product, including a computer-readable medium in which computer program instructions are stored, which instructions, when read by a computer, cause the computer to perform a method for verifying a computer program-under-test, which is carried out by accepting a request for user input responsively to the program-under-test, memorizing the request for user input, associating an unidentified resource with the request for user input, determining when the unidentified resource is actually required in an execution of the program-under-test, and thereafter accepting information from a user to satisfy the request for user input, binding the information to the unidentified resource to define a late-bound resource, and using the late-bound resource in the execution of the program-under-test.

BRIEF DESCRIPTION OF THE DRAWINGS

For a better understanding of the present invention, reference is made to the detailed description of the invention, by way of example, which is to be read in conjunction with the following drawings, wherein like elements are given like reference numerals, and wherein.

DETAILED DESCRIPTION OF THE INVENTION

In the following description, numerous specific details are set forth in order to provide a thorough understanding of the present invention. It will be apparent to one skilled in the art, however, that the present invention may be practiced without these specific details. In other instances well-known circuits, control logic, and the details of computer program instructions for conventional algorithms and processes have not been shown in detail in order not to unnecessarily obscure the present invention.

Software programming code, which embodies aspects of the present invention, is typically maintained in permanent storage, such as a computer readable medium. In a client/server environment, such software programming code may be stored on a client or a server. The software programming code may be embodied on any of a variety of known media for use with a data processing system. This includes, but is not limited to, magnetic and optical storage devices such as disk drives, magnetic tape, compact discs (CD's), digital video discs (DVD's), and computer instruction signals embodied in a transmission medium with or without a carrier wave upon which the signals are modulated. For example, the transmission medium may include a communications network, such as the Internet. In addition, while the invention may be embodied in computer software, the functions necessary to implement the invention may alternatively be embodied in part or in whole using hardware components such as application-specific integrated circuits or other hardware, or some combination of hardware components and software.

Definitions.

The term "variable" is used herein to mean the identification, designation or evaluation of resources. The term "unidentified resource" refers to any element of a design-under-test that does not have a unique, predetermined value. In the context of a software design, the term "variable" may also refer to an object. Typically, such resources include (but are not limited to) signals, registers, groups of signals and groups of registers in the design-under-test. The "value" of a resource means a specific identification of the resource for purposes of a particular operation carried out by the design, for example a field in an instruction. Alternatively, the term value may refer to the content of a field. "Designation" has the same meaning here as identification.

System Overview.

Figure 1:
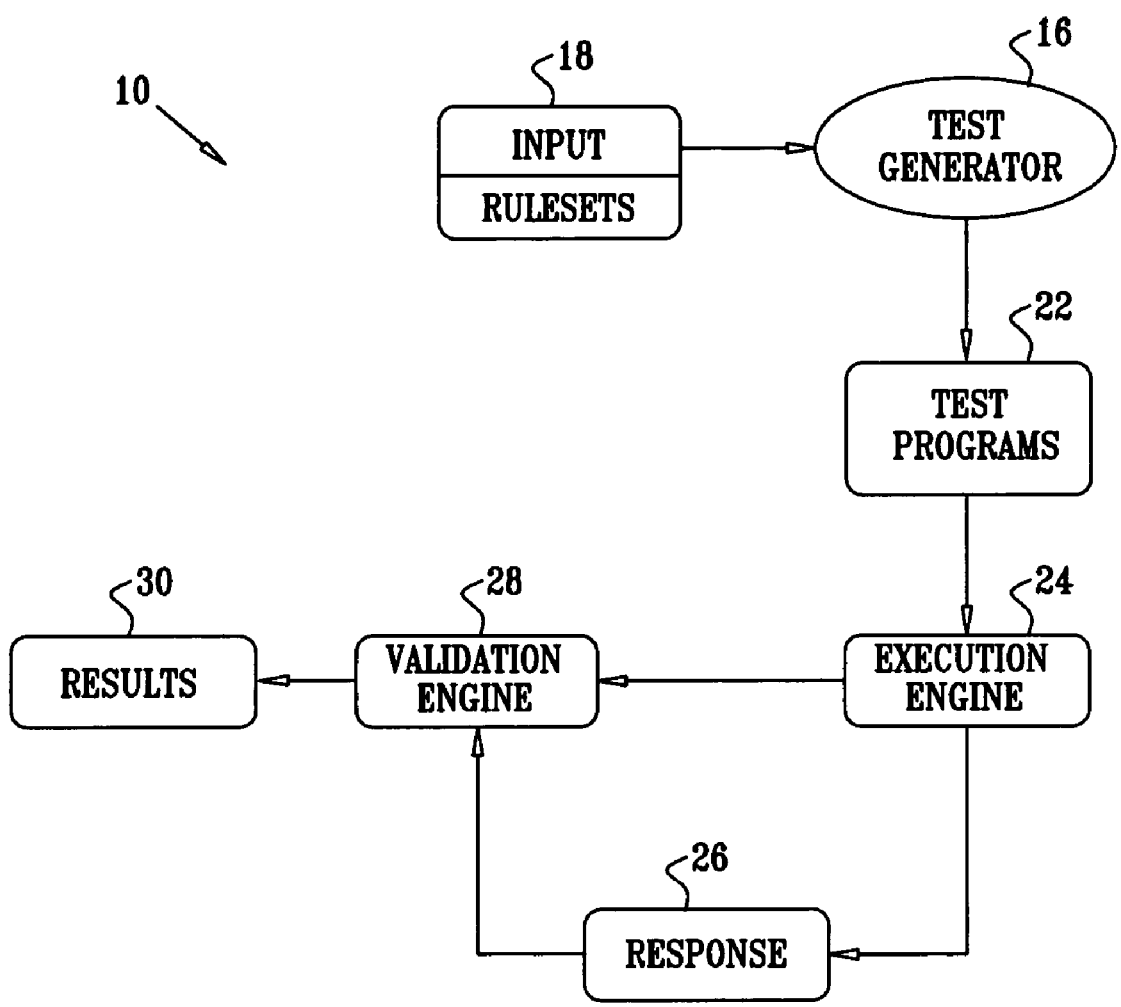
FIG. 1 is a block diagram of a verification system that is constructed and operable in accordance with a disclosed embodiment of the invention.

Turning now to the drawings, reference is made to FIG. 1, which is a block diagram of a typical verification system 10 that is operable in accordance with a disclosed embodiment of the invention. The teachings of the present invention are not restricted to systems that are configured like the verification system 10, but are applicable to many testing systems that have different architectures. Typically, a design-under-test is verified through a suite of test cases to be generated. The solution given here is also appropriate for many other test generation approaches, including manual test generation.

The verification system 10, which can be used for verifying a software or hardware implementation, has several basic interacting components.

The verification system 10 enables the creation of tests that have various degrees of randomness. The ability of the verification system 10 to introduce random unspecified values is generally desirable, since design flaws in practice are usually unpredictable.

A generic test case generator engine 16 has a user input 18, which influences the algorithms used to generate test cases.

Test cases 22 are executed by an execution engine 24 on an implementation of the system-under-test. The execution engine 24 can be a simulator of the system-under-test, or the system-under-test itself. The system-under-test can be a complex software implemented system, for example middleware, or a hardware simulator. Indeed, the system-under-test itself may be a simulator.

Execution of the test cases 22 produces a response 26 from the system. The response 26 is typically submitted to a validation process, represented in FIG. 1 as a validation engine 28, which has knowledge of the expected response, validates the response 26, and produces validation results 30.

Late Binding.

With continued reference to FIG. 1, the case generator engine 16 is adapted to late binding of values. As noted above, generation of interesting test cases for hardware designs that reach dark-corners is a difficult task, even using dynamic generation, because often the state of the design changes before the generated stimuli affect the interesting area in the design. When this occurs, the reason that led to the generation of the specific pattern no longer exists. A solution to this problem according to the instant invention is to delay identification of resources by the case generator engine 16 to parts of the generated stimuli until these resources are actually used in the design. In other words, as long as an attribute having an undefined value is merely copied or moved from one place to another, there is no need to set its value. It is not until an attribute with an undefined value is to be used for calculations or affects the control flow, that the case generator engine 16 is called to set the value of the attribute, shortly before the access is actually performed. This delayed assignment, or late binding, of values or resources allows the case generator engine 16 to have a more accurate view of the state of the design, and thus it can choose the resource, or resolve the value, that more precisely leads to a desired event.

Figure 2:
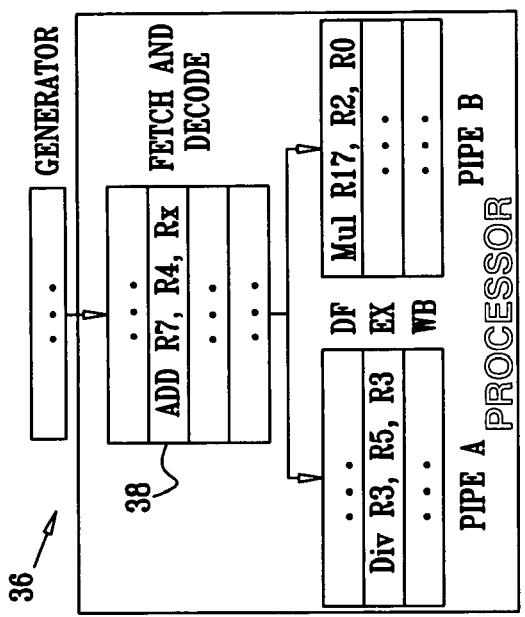
FIG. 2 is a diagram that illustrates a method of generating an instruction having a write-read dependency in accordance with a disclosed embodiment of the invention.
Figure 2:
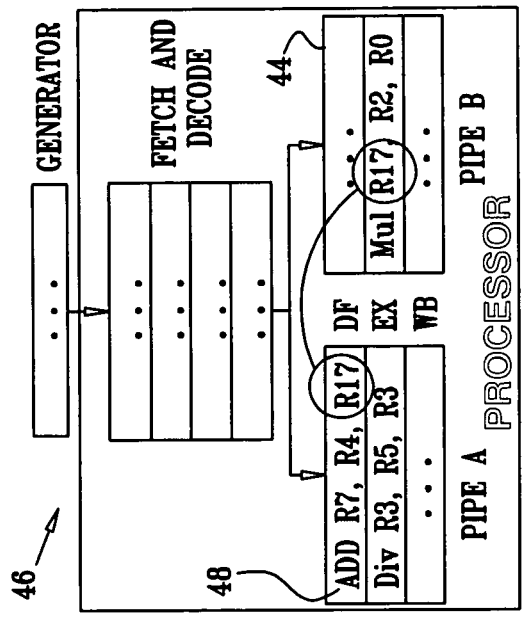
Figure 2:
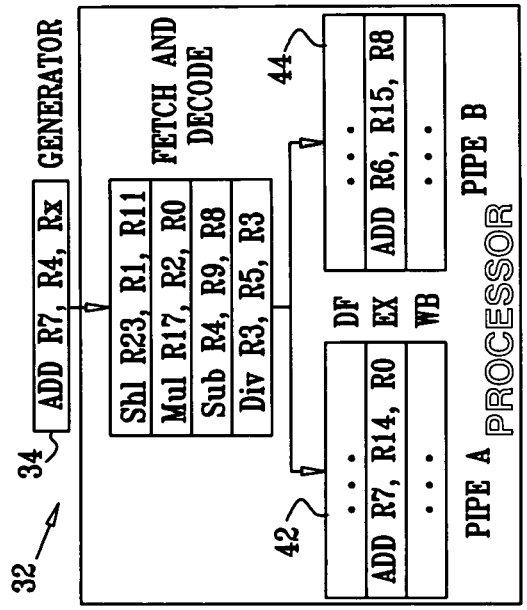
Figure 2:
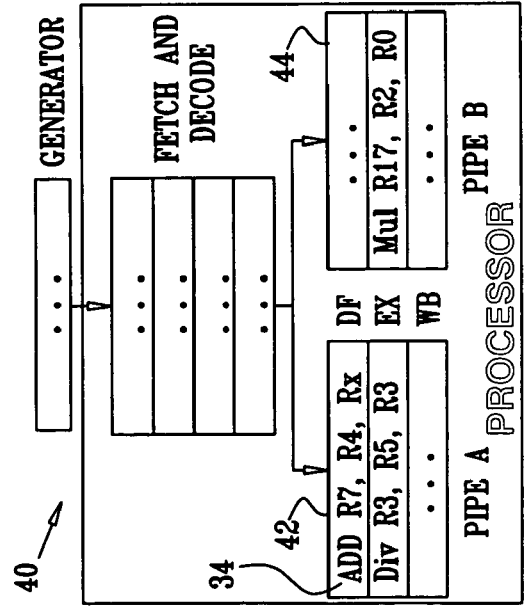

Reference is now made to FIG. 2, which is a diagram that illustrates a method of generating an instruction having a write-read dependency in accordance with a disclosed embodiment of the invention. It is assumed, for the purpose of FIG. 2, that the design-under-test is a hardware processor having execution pipelines, and fetch and decode units. However, it is to be understood that the principles of the invention are not limited to such processors, but can be applied to other hardware designs. Indeed, the invention is applicable to the verification of software designs, as is explained in further detail hereinbelow.

In a first stage 32, the case generator engine 16 (FIG. 1) generates a new add instruction 34 in which the target register is a register R7 and the source registers are a register R4, and a second source register, labeled Rx, which is an as yet unidentified field of the instruction. It should be noted that choosing the second source register based on the current state of the execution pipelines does not lead to the desired results, as will be shown hereinbelow.

After the instruction 34 is fetched in a second stage 36, it flows for several cycles through the fetch and decode units, represented by a block 38. The source register field in the instruction is only copied from place to place in these units. Thus, the undefined value is copied with the rest of the instruction and its identification is not established by the generator.

In a third stage 40, the instruction 34 reaches the data fetch stage in an execution pipeline 42. In this stage, the register file is accessed with the source register to fetch the operand of the instruction. Since this access is not a simple copy, it triggers the test generator to identify the source register. The case generator engine 16 (FIG. 1) examines the state of the pipelines and finds that an instruction MUL R17, R2, R0, at the execution stage in another execution pipeline 44 is writing to a register R17. Therefore, the case generator engine 16 identifies the source register Rx in the instruction 34 as the register R17, and thereby creates the required write-read dependency involving the register R17.

In a fourth stage 46, The final state of the pipelines 42, 44 is shown after the identity of the source register Rx of the instruction 34 has been established. The newly modified instruction 34 has been relabeled as instruction 48 in the stage 46.

Referring again to the stage 32, when the instruction 34 was created, potential target registers R7 and R6 were engaged by instructions flowing through the pipelines 42, 44, respectively. None of these potential target registers can be used to create the requested dependency. When simulating late binding in this manner, it is important to maintain precise simulation semantics in order to properly represent these registers.

First Implementation of Late Binding.

Figure 3:
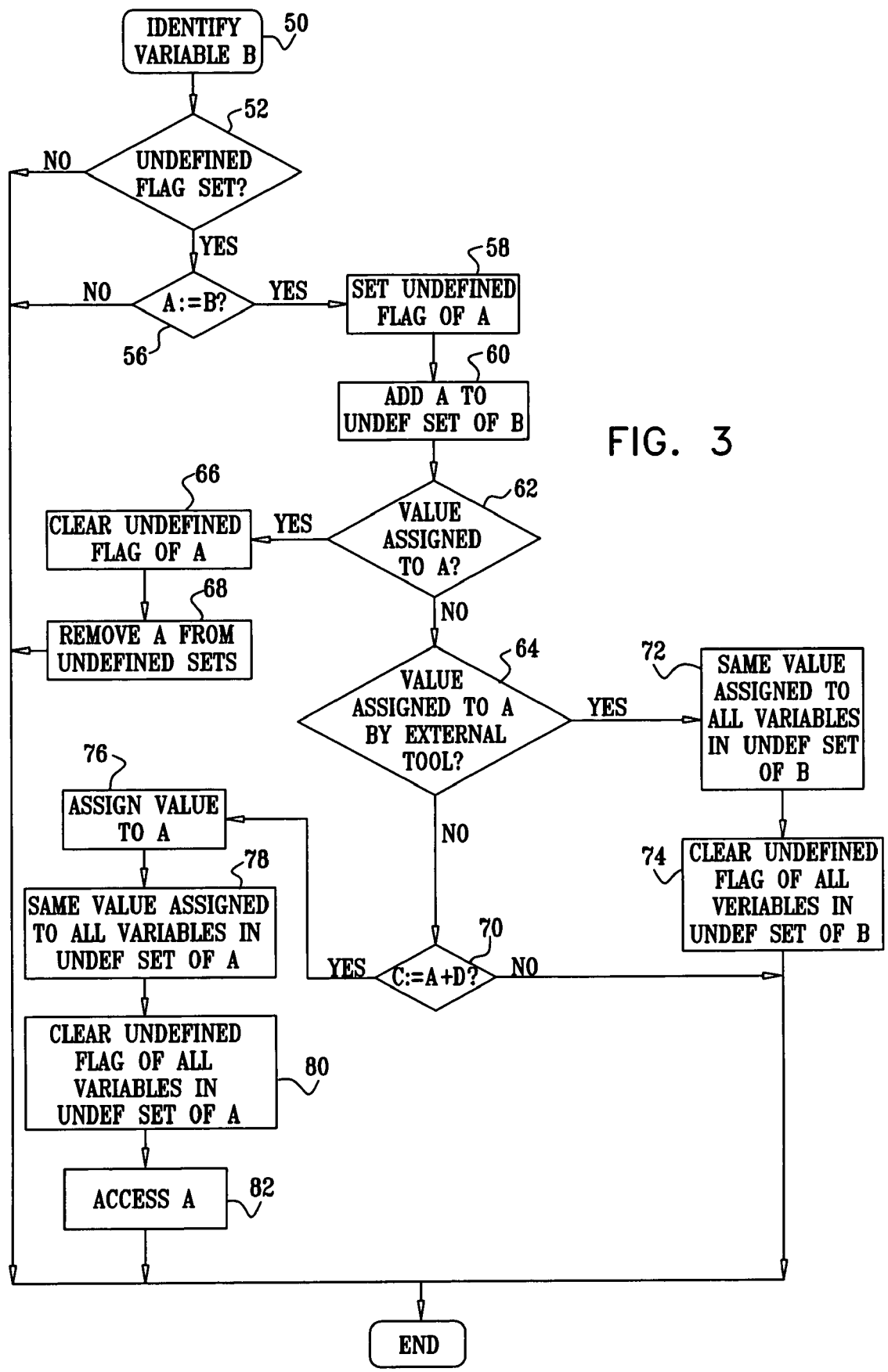
FIG. 3 is a flow diagram illustrating a method for implementation of late binding in accordance with a disclosed embodiment of the invention.

Reference is now made to FIG. 3, which is a flow diagram illustrating a method for implementation of late binding, while maintaining correct simulation semantics in accordance with a disclosed embodiment of the invention. The method, disclosed with reference to FIG. 3 for purposes of presentation, can be used in many verification systems, including the verification system 10 (FIG. 1), in order to implement the technique of late binding that has been described with reference to FIG. 2.

Each variable in the design is associated with a Boolean flag that indicates if its identification is undefined and a pointer to a set or linked list that contains all the other variables that should have the same identification, respectively. Linked lists referenced by pointers are a convenient way to maintain sets of variables. However, other techniques of implementing sets will occur to those skilled in the art, and can be used to carry out the invention. Access to a variable having its undefined flag set during simulation using a test generator is handled in the following way. At initial step 50, a variable B is identified during simulation for further treatment.

Control now proceeds to decision step 52, where it is determined if the variable B has its undefined flag set, meaning that its identity among, for example a set of registers, is currently not established. If the determination at decision step 52 is negative, then the identity of the variable B is already known. Hence, the inventive late binding technique is not currently applicable to the variable B. Control proceeds to final step 54, and the procedure terminates.

If the determination at decision step 52 is affirmative, then control proceeds to decision step 56, where it is determined if the variable B is being copied to another variable A. If the determination at decision step 56 is negative, then control proceeds to final step 54.

If the determination at decision step 56 is affirmative, then control proceeds to step 58, where the undefined flag associated with the variable A is set.

Next, at step 60, the variable A is added to a set of undefined variables that are currently associated with the variable B, all of which have their undefined flags set, and the set of undefined variables associated with the variable A is equated to the set of the variable B.

Control now proceeds to decision step 62, where it is determined if a value is being assigned to the variable A in the simulation. If the determination at decision step 62 is negative, then control proceeds to decision step 64, which is described below.

If the determination at decision step 62 is affirmative, then control proceeds to step 66, where the undefined flag of the variable A is cleared.

Next, at step 68, the variable A is removed from the sets of variables with undefined values with which it is currently associated. Control then proceeds to final step 54.

Decision step 64 is performed when the determination at decision step 62 was negative. Here it is determined if a value is being assigned to the variable A by an external tool, for example the test generator. When an external tool assigns a particular value to a variable presently having an undefined value, it is desirable that the particular value also be associated with all the copies, that is to all members of the set of undefined values with which the variable is associated. The effect of such an assignment is equivalent to assigning this value primarily, instead of leaving the value undefined and employing late binding.

In contrast, at decision step 62, one is dealing with an assignment that is made by the design itself. This is a local assignment that overrides the undefined value. Therefore, in this case the assignment is limited to one variable, while all copies still remain undefined.

If the determination at decision step 64 is negative, then control proceeds to decision step 70, which is described below.

If the determination at decision step 64 is affirmative, then control proceeds to step 72. Here the identity that was assigned to the variable A in decision step 64 is assigned to each member of the set of undefined variables that is associated with the variable B.

Next, at step 74, the undefined flag of each member of the set of undefined variables that is associated with the variable B is cleared. Control then proceeds to final step 54.

Decision step 70 is performed when the result of the determination at decision step 64 is negative. A determination is made whether the variable A is being accessed for a purpose other than copying, for example in the course of an assignment, for example C:=A+D.

If the determination at decision step 70 is negative, then control proceeds to final step 54.

If the determination at decision step 70 is affirmative, then control proceeds to step 76. Here late binding of the variable A occurs. A value is assigned to the variable A. That is to say, the variable A is identified with a member of its group, such as a particular register, or the content of the variable A is resolved.

Next, step 78 and step 80 are performed on the variable A in the same manner as step 72 and step 74, respectively. The details are not repeated in the interest of brevity.

Next, at step 82 the variable A is accessed, for example in order to accomplish the purpose noted in decision step 70. Control then proceeds to final step 54.

Second Implementation of Late Binding.

In the method disclosed with reference to FIG. 3, late binding is supported, while maintaining correct simulation semantics. An undefined value or identification can exist as long as the value is merely copied or moved from place to place. If a resource with an undefined identity is involved in any other operation, the case generator engine 16 (FIG. 1) is called and the value of the variable is resolved. This method is useful in high-level descriptions, such as transaction level models, where many assignments exist and the operations on resources may be complex. As the level of description gets lower, the number of pure copy operations gets smaller. Therefore, the possibility that an undefined resource will survive and reach areas deep in the design is reduced. As a result, the chances that the example of FIG. 2 will work in a register transfer level (RTL) description of a processor are practically zero. On the other hand, many operations in RTL descriptions are simple Boolean functions such as AND, OR, NOT, and XOR. Therefore, the method disclosed in FIG. 3 could not be efficiently employed as to these Boolean functions.

Figures 4, 5:
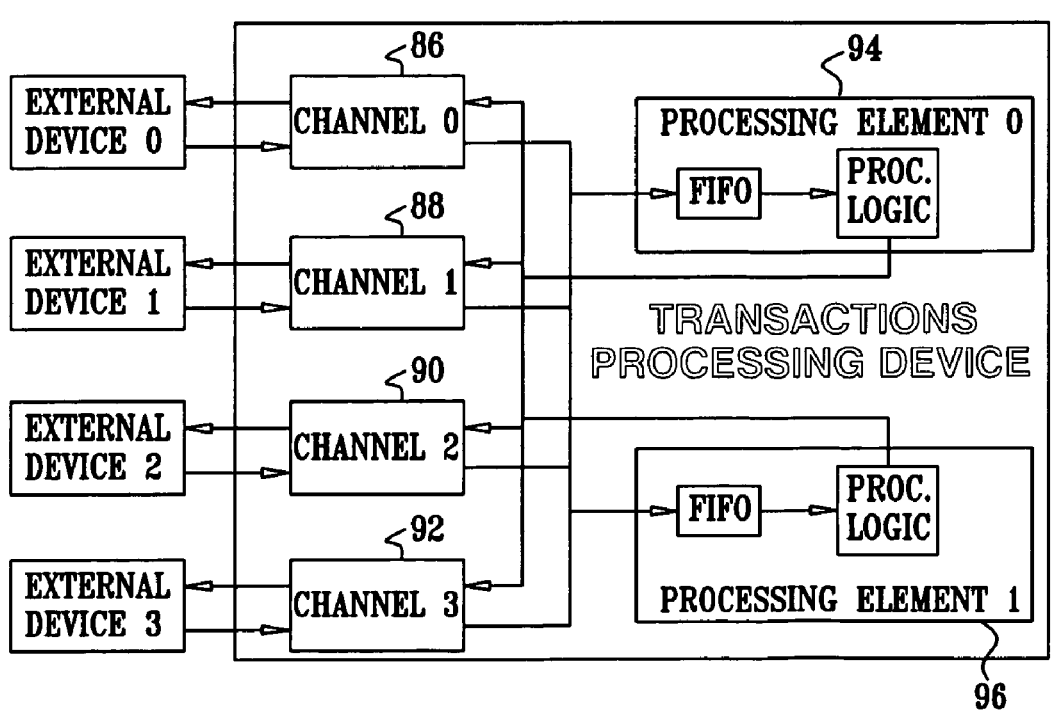
FIG. 4 shows a truth table of a simple AND gate with two inputs, A and B, and an output Y illustrating the principles of a disclosed embodiment of the invention.
FIG. 5 is a high level block diagram of an I/O device suitable for design verification in accordance with a disclosed embodiment of the invention.

Reference is now made to FIG. 4, which shows a truth table of a simple AND gate with two inputs, A and B, and an output Y. The two left columns in the table show the inputs to the gate before the output is evaluated. The other columns show the inputs and output of the gate after the output is evaluated. A notation $U_x$ represents an undefined value, and a notation $R_x$ represents an undefined value that was resolved, that is, the input x was assigned by the case generator engine 16 (FIG. 1). The middle section of the table shows the evaluation of the gate according to the basic method disclosed above with respect to FIG. 3. Since operation of the AND gate is not a simple copy operation, each time the output is evaluated, the values of the inputs are resolved before the actual evaluation occurs, according to the basic method. For example, the third non-header row in the table shows a case in which the value of the input A is 0, while the value of the input B is undefined. In this case, according to the basic method, the value of the input B is resolved before the output is evaluated, although the value of the input B does not affect the value of the output Y.

The need to resolve the value of the input B in the example above can be avoided by using lazy resolution; that is, by delaying resolution of undefined values until they are actually needed to determine the value of the evaluated output. In the example above, the value 0 of the input A determines the value of the output Y, and therefore, using lazy resolution, there is no need to resolve the undefined value of the input B.

When one of the inputs to the AND gate has the value 1, the gate just copies the value of the other input to its output. Following the spirit of the basic algorithm, if the value of the other input is undefined, it should be copied to the output of the gate. This "smart" resolution scheme is shown in the right section of the table in FIG. 4. Using smart resolution, undefined values at the inputs of an AND gate need to be resolved only if both inputs are undefined and neither input is a copy of the other. For example, if at an earlier time an assignment A:=B was executed, then the variable A is a copy of the variable B, and no evaluation is needed when using smart resolution. Whether the variables are copies can be determined by consulting the linked list of one of them. If the other variable is found in the list, then the two variables are copies. This scheme can be further improved by resolving just one of the inputs to the gate when both inputs are undefined. If this resolved input is determinative of the output, then there is no need to resolve the other input.

Modifications of the smart resolution technique disclosed above for use with other logical gates will be apparent to those skilled in the art. For example, in an OR gate, if one of the inputs has a value 1, which is outcome determinative, there is no need to resolve the value of the other input, should it be presently undefined.

To handle inverters and other inverting gates, a flag is associated with each attribute. This flag indicates whether or not the undefined value in the attribute is inverted, compared to the head of the set of attributes having the same undefined value. When an inverter with undefined input is evaluated, the output is added to the undefined set of the input as explained above with respect to step 60 (FIG. 3), and the inverted flag of the output is set to the negation of the inverted flag of the input.

Using the "smart" resolution scheme and the inverter handling, it is possible to handle all Boolean functions with two inputs without any resolution, unless both inputs are undefined. It is also possible to handle more complex entities that are often used in RTL descriptions, such as multiplexers.

Listing 1 is a pseudocode fragment, which describes a generic method for use with a test generator that handles arbitrary Boolean functions. The method starts by constructing a set C of the inputs with an undefined value, to which the output is sensitive, i.e., the value of the output may be affected by the values of these inputs. Next, the an input c is chosen in the set C and the case generator is called to resolve its value. There are many possible heuristics for choosing the input c. For example, choosing the input that creates the greatest reduction in the set C, choosing the input that is less needed to reach a required event, etc. After the input c is resolved, it is removed from the set C. In addition, all other inputs in the set C, to which the output is no longer sensitive, are also removed from the set C. These steps are continued until at most one input remains in the set C. If the set C is empty, the value of the output is determined. If one input is left in the set C, then the output is either a copy or a negation of the remaining input. In this case, the undefined flag of the output is set and the output is added to the undefined value set of the remaining input.

EXAMPLE 1

The method disclosed with reference to FIG. 3 has been tested using the Odette Verification Environment, details of which are available from the European Electronic Chips & Systems design Initiative, 2 Avenue de Vignate, Parc Equation, 38610 Giéres, France. The Odette Verification Environment provides verification support for object-oriented designs. It is built on top of the SystemC class library, available from Open SystemC Initiative, 1177 Branham Lane #302, San Jose, Calif., 95118-3766. The current prototype has been implemented outside the simulation kernel of SystemC. Therefore, it supports late binding only for a small set of types, namely objects and data-members of objects that are built-in C++ types.

Reference is now made to FIG. 5, which is a high level block diagram of an I/O device 84, the design of which was verified using the current prototype in order to evaluate the effectiveness of the late binding technique and its ability to improve test coverage. The device 84 receives requests through four channels 86, 88, 90, 92 and processes the requests using two processing elements 94, 96. The processing element that processes each request is determined by the type of the request. Each channel, upon receiving a request, checks its validity and sends it to the proper processing element. Requests are stored in a queue until the processing element can handle them. The processing elements 94, 96 read the requests in their respective queues one at a time, and process them. Upon completion of the service, a response is sent to the requesting channel.

Because the processing elements 94, 96 service requests independently, and possibly at different rates, it is possible that requests are serviced out-of-order (i.e., two requests received in the channel 86 could be handled by different processing elements 94, 96, and could be serviced in the reverse order from which they were received). The goal of the verification in this example was to cover all possible out-of-order events that could occur in the device 84.

Three types of generation schemes were compared: static generation, dynamic generation, and dynamic generation with late binding. The generation strategy in all the schemes was to send a first request to the processing element having the longer queue, followed by a second request to the other processing element. Since there is a high probability that the first request would experience a longer delay while waits in the longer queue than the second request, the likelihood of an out-of-order event would be significant.

The implementation of this strategy in the three generation schemes was as follows:

Using static generation, the generator generated a sequence of requests to one of the processing elements in an attempt to fill its queue. It then generated a request to the other processing element.

Using dynamic generation, the generator examined the state of the two queues before a request was generated, and set the type of the request to a category required to be handled by the processing element having the longer queue. The next request was sent to the other processing element.

When late binding was used, the value of the request type, which, as noted above, determines the processing element in which it is to be served, was set to be undefined. When the input channel finished its local processing of the request, it attempted to select the processing element to service the request according to the request type. Since the value of the type was undefined at this stage, the generator was called to resolve it. At this stage, the generator had an accurate view of the state of the queues in the two processing elements 94, 96, and it set the request type to a value requiring service of the request by the processing unit having the longer queue. The input channel accordingly selected this processing unit. The next request was sent to the other processing element.

Figures 6, 7:
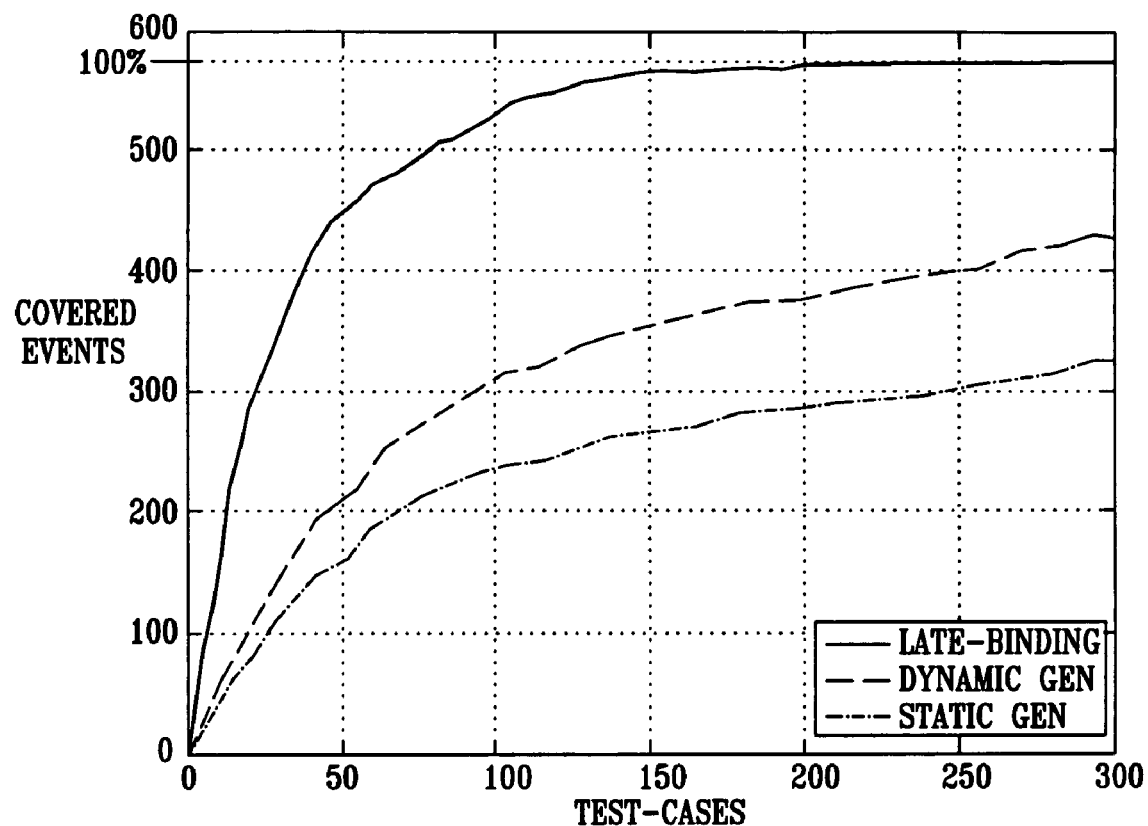
FIG. 7 is a table that compares the simulation time of two versions of the I/O device shown in FIG. 5, in accordance with a disclosed embodiment of the invention.

Reference is now made to FIG. 6, which is a graph comparing coverage of out-of-order events for the three generation schemes. The graph shows that 100% of possible out-of-order events were covered by dynamic generation with late binding in less than 300 test-cases, while dynamic and static generation were able to reach only 75% and 60% of the out-of-order events, respectively.

Simulation times of test cases on two models of the device 84 that differed in their level of abstraction are illustrated. In one model the handling of the transactions both in the channels and the processing elements was done using simple functions, while in the second models the implementation of these functions was more detailed and was closer to an actual low-level implementation. Measurements were taken for three cases:

1. No late binding. That is, the late binding option was turned off.
2. Late binding was turned on, but was not used. That is, some attributes in the requests could have undefined values, but the generator never set the values of the attributes to be undefined.
3. Late binding was used. The generator followed the generation strategy for late binding described above.

Reference is now made to FIG. 7, which is a table that compares the simulation time of these three cases for both models of the I/O device in accordance with a disclosed embodiment of the invention. The table shows that simply activating late binding slowed the simulation by 10%. Using the late binding capabilities increased the slowdown to 30%. Most of delay can be attributed to time spent in the generator itself, and only a small part is spent in maintenance of the sets of attributes having the same undefined values. Therefore, it is expected that slowdown will become less dominant as the simulation rate decreases and simulation performance becomes more important. For example, while simulation time more than doubled in the second model (for the same test-cases), the overhead of using late binding increased from 5.2 seconds to 6.5 seconds, or by just 25%.

Alternative Embodiment

The techniques of late binding can be used advantageously to improve efficiency of both concurrent and sequential software applications. Conventionally, a software application can prompt the user for information to be assigned to a resource, which is typically a variable, the identity of which is resolved at the time of the user's input. However, in some circumstances the program never needs to use the information, and thus never needs to access this resolved variable. However in all cases, using the conventional approach, the variable is unavailable in the pool, and hence the application is to that extent, deprived of a resource. Referring again to FIG. 3, in the context of a software design, step 76 is modified to include prompting the user for information, and associating this information with the variable A at the time the variable A is resolved. Similarly, using the techniques of lazy resolution disclosed above with reference to Listing 1, the user is prompted for information only when it is necessary to resolve the input c. The advantages of this technique are twofold. First, the user is spared the burden of inputting information unnecessarily, and secondly the design operates with greater efficiency.

Figure 8:
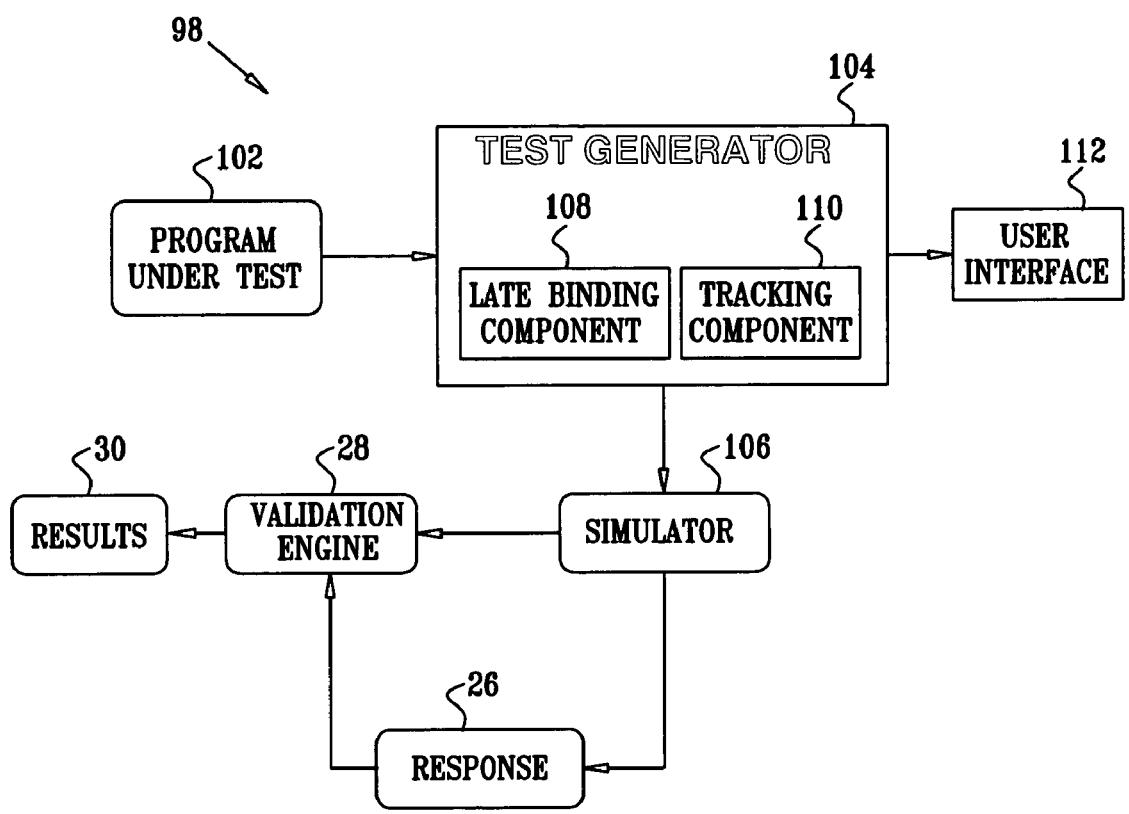
FIG. 8 is a block diagram of a software verification system that is constructed and operable in accordance with a disclosed embodiment of the invention.

Reference is now made to FIG. 8, which is a block diagram of a software verification system 98, that is adapted to software testing and is constructed and operable in accordance with a disclosed embodiment of the invention. The operation of the software verification system 98 is similar to that of the verification system 10 (FIG. 1), except now the input is a program-under-test 102. A case generator 104 is responsible for providing variables to a simulator 106, which actually executes the program-under-test 102.

The case generator 104 is provided with a late binding component 108. During execution, the program-under-test 102 may request a particular input to be assigned to a variable. However, this request is not immediately presented to the users, but instead is held in abeyance in a buffer within a tracking component 110. Subsequently, when an unidentified variable that would contain the particular input is actually required in the simulation, the tracking component 110 causes the case generator 104 to generate a request for a user to provide the particular input via a user interface 112. The user interface 112 is configured in some embodiments to present the context in which the requested input is to be used. Responsively to the user input, the late binding component 108 binds the input to the variable. The bound variable is then communicated to the simulator 106.

The case generator 104 is aware of program context, and in many cases is capable of generating the requested input with a high probability of being correct. In some embodiments, the case generator 104 reports via the user interface 112 whether the requested input was ever actually needed, or merely remained in abeyance during the simulation.

EXAMPLE 2

The following pseudocode illustrates one mode of operation of the software verification system 98.

```
input x
  ...
  ...
Much later first use of x
if (x == 87654 ) then {
Show it to a user OR
Show it to a generator
}
```

Here the generator is context-aware. It knows that if x is used in a condition, generate values such that in one case x==87654 is true and in another case the condition is false. So with high probability the generator generates x as 87654, which otherwise would have negligible probability. This obviously improves the testing.

```
Second execution.
input x
  ...
  ...
Much later first use of x,
    which is different from the first execution.
if (x == y ) then
  ...
  ...
```

In the second execution, use of the variable x does not occur in same location in the program as in the first execution, as it depends on other inputs. Assume that y is now 99. The generator will put x=99 with a high probability of correctness, (as the user would).

The binding of the variable x is dynamic, and is better then a static analysis, which could have determined 87654 to be a good value from a general understanding of the program.

Methods and systems have been presented herein to increase the ability of test generators to reach obscure cases in the design by delaying the assignment of values in the generated stimuli until they are needed by the design. This late binding technique allows a test generator to have a more accurate view of the state of the design, and thus it can more precisely choose the values that lead to a desired event. Experimental results indicate that late binding can significantly improve coverage with a reasonable penalty in simulation time. It will be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art, which would occur to persons skilled in the art upon reading the foregoing description.

COMPUTER PROGRAM LISTINGS

Listing 1

```
while |C |> 1 do {
    Choose an input c from C;
    Resolve the value of c;
    Remove from C any inputs to which the output is no
longer sensitive;
    if |C |= 1 then
        The value of the output is undefined;
        The output is added to the undefined value set of
    the input in C;
    else
        The value of the output is determined;
}.
```

The invention claimed is:

1. A method of verifying a design, comprising the steps of:
generating a stream of instructions, said stream including a first instruction that references an unidentified first resource;
setting a first flag that designates said first resource as being unidentified;
copying said first resource to a second resource;
setting a second flag that designates said second resource as being unidentified;
including said second resource in a set of unidentified resources that is associated with said first resource, wherein each member of said set has a status flag designating said member as being unidentified; and
thereafter performing the steps of
identifying said second resource;
clearing said second flag; and
removing said second resource from said set.

2. The method according to claim 1, wherein said step of identifying said second resource further comprises the steps of:
identifying each said member of said set with said second resource; and
clearing said status flag of each said member.

3. The method according to claim 2, further comprising the step of accessing said second resource.

4. The method according to claim 1, further comprising the step of accessing said second resource.

5. The method according to claim 1, wherein said step of identifying said second resource comprises requesting a content of said second resource.

6. A computer software product, comprising a computer-readable medium in which computer program instructions are stored, which instructions, when read by a computer, cause the computer to perform a method of verifying a design, comprising the steps of:
generating a stream of design instructions, said stream including a first instruction that references an unidentified first resource;
setting a first flag that designates said first resource as being unidentified;
copying said first resource to a second resource;

setting a second flag that designates said second resource as being unidentified;

including said second resource in a set of unidentified resources that is associated with said first resource, wherein each member of said set has a status flag designating said member as being unidentified; and thereafter performing the steps of identifying said second resource;

clearing said second flag; and removing said second resource from said set.

7. The computer software product according to claim 6, wherein said step of identifying said second resource further comprises the steps of:

identifying each said member of said set with said second resource; and clearing said status flag of each said member.

8. The computer software product according to claim 7, further comprising the step of accessing said second resource.

9. The computer software product according to claim 6, further comprising the step of accessing said second resource.

10. The computer software product according to claim 6, wherein said step of identifying said second resource comprises requesting a content of said second resource.

11. A verification system for verifying a design, comprising a test generator adapted to perform the steps of:

generating a stream of instructions, said stream including a first instruction that references an unidentified first resource;

setting a first flag that designates said first resource as being unidentified;

copying said first resource to a second resource;

setting a second flag that designates said second resource as being unidentified;

including said second resource in a set of unidentified resources that is associated with said first resource, wherein each member of said set has a status flag designating said member as being unidentified; and thereafter performing the steps of:

identifying said second resource;

clearing said second flag; and removing said second resource from said set.

12. The verification system according to claim 11, wherein in said step of identifying said second resource said test generator is further adapted to identify each said member of said set with said second resource; and to clear said status flag of each said member.

13. The verification system according to claim 11, wherein immediately prior to identifying said second resource said test generator requests a content of said second resource.

14. A method of verifying a design, comprising the steps of:

generating a stream of instructions for evaluation of a Boolean function in said design;

constructing a set of inputs for said Boolean function, said set comprising members having unidentified input resources, and said inputs being outcome determinative of said Boolean function, said Boolean function further having an output resource;

selecting one of said members;

resolving an identity of said selected member;

excluding said selected member from said set of inputs;

removing all remaining members of said set of inputs that are no longer outcome determinative of said Boolean function;

iterating said steps of selecting, resolving, excluding and removing until no more than one member remains in said set of inputs; and determining said output resource as a copy of said one member.

15. The method according to claim 14, further comprising the steps of:

setting a flag that designates said output resource as being unidentified; and including said output resource in a set of unidentified resources that is associated with said one member, respective status flags being associated with each member of said set of unidentified resources that designate an unidentified status thereof.

16. The method according to claim 15, further comprising the steps of:

associating a respective inversion flag with each of said input resources and said output resource that indicate an inversion status thereof; and setting said inversion flag of said output resource to a negation of said inversion flag of one of said input resources that corresponds to said one member.

17. A computer software product, comprising a computer-readable medium in which computer program instructions are stored, which instructions, when read by a computer, cause the computer to perform a method of verifying a design, comprising the steps of:

generating a stream of design instructions for evaluation of a Boolean function in said design;

constructing a set of inputs for said Boolean function, said set comprising members having unidentified input resources, and said inputs being outcome determinative of said Boolean function, said Boolean function further having an output resource;

selecting one of said members;

resolving an identity of said selected member;

excluding said selected member from said set of inputs;

removing all remaining members of said set of inputs that are no longer outcome determinative of said Boolean function;

iterating said steps of selecting, resolving, excluding and removing until no more than one member remains in said set of inputs; and determining said output resource as a copy of said one member.

18. The computer software product according to claim 18, wherein said computer is further instructed to perform the steps of:

setting a flag that designates said output resource as being unidentified; and including said output resource in a set of unidentified resources that is associated with said one member, respective status flags being associated with each member of said set of unidentified resources that designate an unidentified status thereof.

19. The computer software product according to claim 18, wherein said computer is further instructed to perform the steps of:

associating a respective inversion flag with each of said input resources and said output resource that indicate an inversion status thereof; and setting said inversion flag of said output resource to a negation of said inversion flag of one of said input resources that corresponds to said one member.

20. A verification system of verifying a design, comprising a test generator adapted to perform the steps of:
- generating a stream of instructions for evaluation of a Boolean function in said design;
- constructing a set of inputs for said Boolean function, input resources associated with members of said set of inputs being unidentified, and said inputs being outcome determinative of said Boolean function, said Boolean function further having an output resource;
- selecting one of said members;
- resolving an identity of said selected member;
- excluding said selected member from said set of inputs;
- removing all remaining members of said set of inputs that are no longer outcome determinative of said Boolean function; and
- iterating said steps of selecting, resolving, excluding and removing until no more than one member remains in said set of inputs.

21. The verification system according to claim 20, wherein said test generator is further adapted to perform the steps of:
- determining said output resource as a copy of said one member;
- setting a flag that designates said output resource as being unidentified; and
- including said output resource in a set of unidentified resources that is associated with said one member, a respective status flag being associated with each member of said set of unidentified resources that designates an unidentified status thereof.

22. The verification system according to claim 21, wherein said test generator is further adapted to perform the steps of:
- associating a respective inversion flag with each of said input resources and said output resource that indicate an inversion status thereof; and
- setting said inversion flag of said output resource to a negation of said inversion flag of one of said input resources that corresponds to said one member.

* * * * *